United States Patent
Zhu et al.

(10) Patent No.: US 11,374,094 B2
(45) Date of Patent: Jun. 28, 2022

(54) SILICON CARBIDE DIODE HAVING HIGH SURGE CURRENT CAPABILITY AND MANUFACTURING METHOD THEREOF

(71) Applicant: WUXI NCE POWER CO., LTD, Wuxi (CN)

(72) Inventors: Yuanzheng Zhu, Wuxi (CN); Zhuo Yang, Wuxi (CN); Jingcheng Zhou, Wuxi (CN); Peng Ye, Wuxi (CN)

(73) Assignee: WUXI NCE POWER CO., LTD, Wuxi (CN)

(*) Notice: Subject to any disclaimer, the term of this patent is extended or adjusted under 35 U.S.C. 154(b) by 314 days.

(21) Appl. No.: 16/623,961

(22) PCT Filed: Sep. 12, 2018

(86) PCT No.: PCT/CN2018/105133
§ 371 (c)(1),
(2) Date: Dec. 18, 2019

(87) PCT Pub. No.: WO2020/042221
PCT Pub. Date: Mar. 5, 2020

(65) Prior Publication Data
US 2021/0336010 A1    Oct. 28, 2021

(30) Foreign Application Priority Data

Aug. 29, 2018 (CN) .......................... 201810991533.9
Aug. 29, 2018 (CN) .......................... 201810991544.7

(51) Int. Cl.
*H01L 29/872* (2006.01)
*H01L 29/16* (2006.01)
(Continued)

(52) U.S. Cl.
CPC ...... *H01L 29/1608* (2013.01); *H01L 29/0619* (2013.01); *H01L 29/66143* (2013.01); *H01L 29/872* (2013.01)

(58) Field of Classification Search
CPC ............. H01L 29/1608; H01L 29/0619; H01L 29/66143; H01L 29/872
See application file for complete search history.

(56) References Cited

U.S. PATENT DOCUMENTS

| 8,956,963 B2* | 2/2015 | Yen ...................... H01L 29/6606 438/571 |
| 2003/0020133 A1* | 1/2003 | Dahlqvist ........... H01L 27/0814 257/471 |

(Continued)

FOREIGN PATENT DOCUMENTS

DE    102005046706 A1 *    4/2007    ......... H01L 29/0847

*Primary Examiner* — Khaja Ahmad
*Assistant Examiner* — Pavel G Ivanov
(74) *Attorney, Agent, or Firm* — Bayramoglu Law Offices LLC (57) ABSTRACT

A silicon carbide diode having a high surge current capability, and including a semiconductor base plate. The semiconductor base plate includes an N-type silicon carbide substrate and an N-type silicon carbide epitaxial layer located on the N-type silicon carbide substrate. The upper portion of the N-type silicon carbide epitaxial layer is provided with a plurality of P-type well regions. The N-type high resistance region is provided under the P-type well region or on the lower surface of the P-type well region. The resistivity of the N-type high resistance region is greater than the resistivity of the N-type silicon carbide epitaxial layer. The N-type high resistance region is provided under the P-type well region, and a plurality of grooves are provided in the P-type well region or a plurality of block-shaped P-type regions uniformly arranged at intervals are provided in the N-type high resistance region.

14 Claims, 9 Drawing Sheets

(51) Int. Cl.
*H01L 29/06* (2006.01)
*H01L 29/66* (2006.01)

(56) References Cited

U.S. PATENT DOCUMENTS

| | | | | |
|---|---|---|---|---|
| 2009/0160008 A1* | 6/2009 | Fujiwara | ............... | H01L 29/872 |
| | | | | 257/471 |
| 2011/0215338 A1* | 9/2011 | Zhang | .................... | H01L 29/47 |
| | | | | 257/73 |
| 2013/0181328 A1* | 7/2013 | Cao | .................... | H01L 29/0657 |
| | | | | 257/618 |

* cited by examiner

SILICON CARBIDE DIODE HAVING HIGH SURGE CURRENT CAPABILITY AND MANUFACTURING METHOD THEREOF

CROSS REFERENCE TO THE RELATED APPLICATIONS

This application is the national phase entry of International Application No. PCT/CN2018/105133, filed on Sep. 12, 2018, which is based upon and claims priority to Chinese Patent Application No. CN201810991533.9 & CN201810991544.7, filed on Aug. 29, 2018, the entire contents of which are incorporated herein by reference.

TECHNICAL FIELD

The present disclosure relates to a diode and the manufacturing method thereof. In particular, the present disclosure relates to a silicon carbide diode having a high surge current capability and a manufacturing method thereof and belongs to the technical field of manufacturing semiconductor devices.

BACKGROUND

Power devices and modules thereof provide an effective approach to realizing the conversion between various forms of electric energy and have been widely applied in the fields of national defense construction, transportation, industrial production and medical hygiene. Since the first power device application in the 1950s, the emergence of each generation of power devices could convert and utilize energy more efficiently.

Traditional power devices and modules are dominated by silicon-based power devices and mainly include thyristors, power PIN devices, power bipolar junction devices, power MOSFETs, and insulated-gate field-effect transistors, which are widely used in the full power range and have become dominant in the market of power semiconductor devices due to their long history and their highly mature design and process technology. However, with the increasingly mature development of the power semiconductor technology, the characteristics of the silicon-based power devices have gradually approached their theoretical limits. While trying to find better parameters in the narrow optimization space of the silicon-based power devices, researchers also noticed that the third-generation wide bandgap semiconductor such as Silicon carbide (SiC) and Gallium nitride (GaN) has excellent material characteristics in the fields of high power, high frequency, high temperature resistance and radiation resistance.

Silicon carbide (SiC) materials have become the international research hotspot of power semiconductor devices due to their excellent performance. Compared with traditional silicon materials, silicon carbide (SiC) has advantages such as large forbidden bandgap, high breakdown field strength and high thermal conductivity. The large forbidden bandgap can lower the intrinsic carrier concentration of silicon carbide, thereby reducing the reverse current of the device. The high breakdown field strength can greatly increase the reverse breakdown voltage of the power devices and reduce the resistance when the devices conduct. The high thermal conductivity can greatly increase the available maximum operating temperature. Moreover, in many fields of high-power applications, such as high-speed railway, hybrid vehicle or intelligent high voltage direct current transmission, SiC-based devices are endowed with a promising future. Meanwhile, the silicon carbide power device can effectively bring down power loss so the silicon carbide power device is praised as the "green energy" device driving the "new energy revolution".

Figure 1:
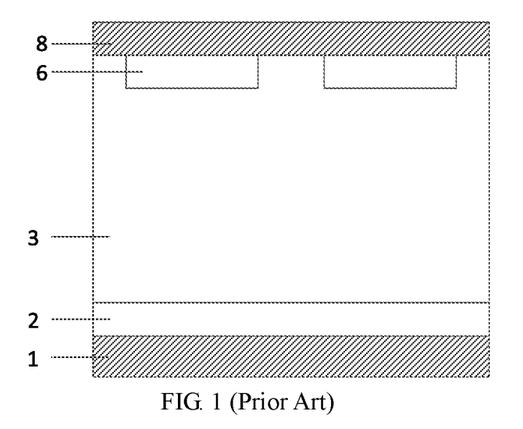
FIG. 1 is a structural schematic view of a conventional silicon carbide Schottky diode.

Currently, silicon carbide power devices include diodes and MOSFET. The most important electrical parameters of the silicon carbide diodes include the breakdown voltage, the forward voltage drop and the junction capacitance and the most important reliability parameter thereof is the surge current capability. At present, the typical silicon carbide diodes structure is Junction Barrier Schottky (JBS) diodes. The typical silicon carbide JBS structure is shown in FIG. 1. In the normal conduction state (a small current) of the device, only the Schottky contact region conducts and the P-type well region does not conduct an electric current. Therefore, the larger the area of the P-type well region, the larger the conduction voltage drop of the device under the same area and the larger the conduction loss. Under the condition of large current (when the surge current comes), the PN junction conducts and injects minority carrier electron holes into the drift region of the device, so as to enhance the surge current capacity of the device. Therefore, the larger the area of the P-type well region, the stronger the surge current capacity of the device. But despite that, since the cut-in voltage of the PN junction diode of the silicon carbide is relatively high, it is difficult to effectively ensure that the PN junction can be effectively turned on when the surge current comes. Even if the PN junction has been turned on, the forward conduction voltage drop of the device is often so high that the temperature of the chip quickly rises and easily breaks down, thereby leading to a relatively poor silicon power surge current capability. On the other hand, if the area of the P-type well region of the JBS diode is greatly enlarged, the surge current capability of the device can be effectively improved. The forward conduction loss of the device is large due to the detriment of the energy conversion efficiency when applied in the system.

Consequently, it is crucial to develop a silicon carbide JBS device with a small forward voltage drop and a large surge current to overcome the deficiencies in the prior art.

SUMMARY

The objective of the present invention is to overcome the deficiencies in the prior art and to provide a silicon carbide diode having a high surge current capability and the manufacturing method thereof. an N-type high resistance region is added under the P-type well region or on the lower surface of the P-type well region and a plurality of grooves, separately arranged at intervals, are provided in the P-type well region, which greatly enhances the surge current capacity of the device under the normal conduction state.

The technical solution of the present disclosure is as follows: a silicon carbide diode having a high surge current capability includes a semiconductor base plate. The semiconductor base plate includes an N-type silicon carbide substrate and an N-type silicon carbide epitaxial layer is located on the N-type silicon carbide substrate. A plurality of P-type well regions are provided on the upper portion inside the N-type silicon carbide epitaxial layer. an N-type high resistance region is provided under the P-type well region or on the lower surface of the P-type well region. The resistivity of the N-type high resistance region is greater than the resistivity of the N-type silicon carbide epitaxial layer.

Further, a plurality of block-shaped P-type regions, uniformly arranged at intervals, are provided in the N-type high resistance region and the block-shaped P-type regions extend from the junction of the N-type high resistance region and the P-type well region into the N-type high resistance region or through the N-type high resistance region into the N-type silicon carbide epitaxial layer.

Further, the width of the block-shaped P-type region is not greater than the thickness of the N-type high resistance region.

Further, an N-type well region is provided between adjacent P-type well regions, and the resistivity of the N-type well region is equal to or smaller than the resistivity of the N-type silicon carbide epitaxial layer.

In order to further achieve the above-mentioned technical objective, the technical solution of the present disclosure also includes a silicon carbide diode having a high surge current capability and including a semiconductor base plate. The semiconductor base plate includes an N-type silicon carbide substrate and an N-type silicon carbide epitaxial layer is located on the N-type silicon carbide substrate. A plurality of P-type well regions are provided on the upper portion inside the N-type silicon carbide epitaxial layer. an N-type high resistance region is provided under the P-type well region or on the lower surface of the P-type well region. The resistivity of the N-type high resistance region is greater than the resistivity of the N-type silicon carbide epitaxial layer. A plurality of grooves are provided in the P-type well region. The groove located at an edge of the P-type well region is adjacent and connected to the N-type silicon carbide epitaxial layer and extends from the upper surface of the semiconductor base plate through the P-type well region into the N-type high resistance region or sequentially passes through the P-type well region and the N-type high resistance region into the N-type silicon carbide epitaxial layer. The groove is filled with an insulating dielectric layer.

Further, an anode metal is provided on the upper surface of the semiconductor base plate and the anode metal forms a Schottky contact with the N-type epitaxial layer and forms an ohmic contact with the P-type well region. A cathode metal is provided on the lower surface of the semiconductor base plate and the cathode metal forms the ohmic contact with the N-type silicon carbide substrate.

Further, the conductive polysilicon and an insulating dielectric layer wrapping the conductive polysilicon are provided inside the groove and the conductive polysilicon is electrically connected to the anode metal.

Further, the N-type well region is provided between adjacent P-type well regions. The N-type well region is adjacent and connected to the groove. The resistivity of the N-type well region is smaller than the resistivity of the N-type high resistance region. The resistivity of the N-type well region is equal to or smaller than the resistivity of the N-type silicon carbide epitaxial layer.

In order to further achieve the above technical purposes, the present disclosure also provides a method for manufacturing the silicon carbide diode having a high surge current capability, including the following steps:

Step 1: selecting an N-type silicon carbide substrate and growing an N-type silicon carbide epitaxial layer on the upper surface of the N-type silicon carbide substrate by an epitaxial process;

Step 2: under the shielding of a first photoresist, selectively injecting a high energy P-type impurity, selectively injecting a low energy P-type impurity, and performing high temperature annealing to activate impurity ions to respectively form an N-type high resistance region and a P-type well region;

Step 3: under the shielding of a second photoresist, etching the N-type silicon carbide epitaxial layer to obtain a plurality of grooves in the P-type well region;

Step 4: growing an insulating oxide layer on the surface of the N-type silicon carbide epitaxial layer and in the grooves, and the grooves are filled with the insulating oxide layer;

Step 5: etching the insulating oxide layer, removing the insulating oxide layer on the surface of the N-type silicon carbide epitaxial layer and forming an insulating dielectric layer in the grooves;

Step 6: performing backgrinding on the lower surface of the N-type silicon carbide substrate; depositing the metal layer to form a cathode metal; depositing the metal layer to form an anode metal on the upper surface of the N-type silicon carbide epitaxial layer to finally obtain the silicon carbide power diode device.

Further, the groove is not full with the insulating oxide layer in step 4, and the polysilicon is deposited on the insulating oxide layer to proceed to fill the groove with polysilicon. The polysilicon and the insulating oxide layer both on the surface of the device are sequentially removed to obtain the conductive polysilicon and the insulating dielectric layer wraps the conductive polysilicon in the groove. The conductive polysilicon is electrically connected to the anode metal.

In order to further achieve the above-mentioned technical objective, the present disclosure also provides a method for manufacturing a silicon carbide diode having a high surge current capability, including the following steps:

Step 1: selecting an N-type silicon carbide substrate and growing an N-type silicon carbide epitaxial layer on the upper surface of the N-type silicon carbide substrate by using an epitaxial process;

Step 2: under the shielding of the first photoresist, selectively injecting the high energy P-type impurity, then selectively injecting the low energy P-type impurity, and performing high temperature annealing to activate impurity ions to respectively form an N-type high resistance region and a P-type well region;

Step 3: performing backgrinding on the lower surface of the N-type silicon carbide substrate; depositing the metal layer to form a cathode metal; depositing the metal layer to form an anode metal on the upper surface of the N-type silicon carbide epitaxial layer to finally obtain the silicon carbide power diode device.

Further, after step 2, under the shielding of the second photoresist, selectively injecting the P-type impurity, then performing high-temperature annealing to activate impurity ions to form a plurality of block-shaped P-type regions distributed at intervals in the N-type high resistance region.

Further, the width of the block-shaped P-type region is not greater than the thickness of the N-type high resistance region.

Further, the N-type high resistance region in step 2 can also be obtained by an epitaxial process as follows:

Growing the N-type high resistance layer on the upper surface of the N-type silicon carbide epitaxial layer;

Under the shielding of the first photoresist, selectively injecting the lower energy P-type impurity onto the surface of the N-type high resistance layer, and removing the first photoresist;

Under the shielding of a third photoresist, selectively injecting the N-type impurity onto the surface of the N-type high resistance layer, and removing the third photoresist;

Then, performing the high-temperature annealing to activate impurity ions to respectively form the P-type well region, the N-type well region in the P-type well region, and the N-type high resistance region under the P-type well region.

Further, the resistivity of the N-type well region and the N-type silicon carbide epitaxial layer are smaller than the resistivity of the N-type high resistance region and the resistivity of the N-type well region is equal to or smaller than the resistivity of the N-type silicon carbide epitaxial layer.

Figure 25:
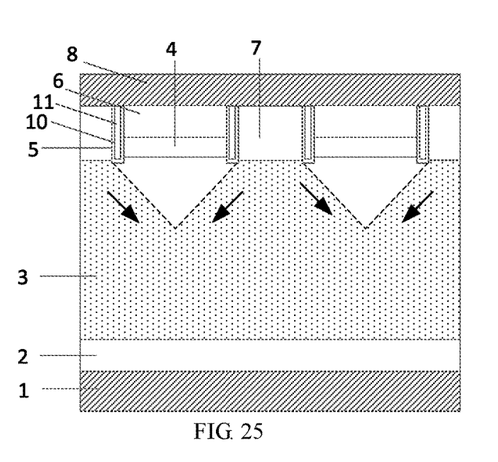
FIG. 25 is a schematic view showing the electron current path under the low current condition of the present disclosure.
Figure 26:
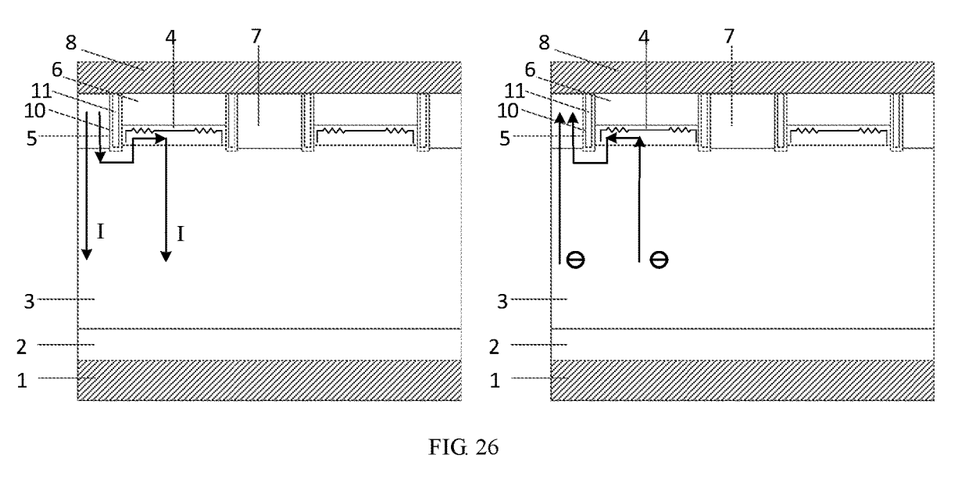
FIG. 26 is a schematic view showing the parasitic resistance in the N-type resistance region under the high current condition of the present disclosure.

Compared with conventional silicon carbide diode devices, the present disclosure has the following advantages:

1) In the present disclosure, an N-type high resistance region is added under the P-type well region or on the lower surface of the P-type well region. As is shown in FIG. 25, under a low current condition, the electron current flows from the anode Schottky junction into the device, flows through the N-type high resistance region, and then diffuses toward the cathode at an angle of about 45 degrees. Basically, the flow of the electron current is not affected by the N-type high resistance region under the P-type well region, thereby not affecting the forward voltage drop of the device. As is shown in FIG. 26, under a high current condition, a considerable part of the electron current flows through the N-type high resistance region under the P-type well region. Due to the parasitic resistance in the N-type high resistance region, a lateral voltage drop will occur in the N-type high resistance region, causing a sharp decline in the electric potential under the center of the P-type well region. Thus, the PN junction in the device can be opened more effectively and a higher current capability can be achieved so the device will have a higher surge current capability.

2) In the present disclosure, a plurality of grooves arranged at intervals are provided in the P-type well region. When the electron current flows through the N-type high resistance region, the grooves are configured to prolong the flow path of the electron current and increase the lateral resistance under the P-type well region, thereby ensuring that the PN junction in the device can be opened more effectively under the high current condition and enhancing the surge current capacity of the device.

3) In the present disclosure, the conductive polysilicon electrically connected to the anode metal is provided in the grooves. When the device is subjected to voltage, the conductive polysilicon and its adjacent N-type silicon carbide epitaxial layer or N-type well region are laterally depleted to generate a transverse electric field, thereby improving the voltage resistant capability of the device.

4) In the present disclosure, a plurality of block-shaped P-type regions arranged at intervals are provided in N-type high resistance region. When the electron current flows through the N-type high resistance region, the block-shaped P-type regions are configured to prolong the flow path of the electron current and increase the lateral resistance under the P-type well region, thereby ensuring that the PN junction in the device can be opened more effectively under the high current condition and improving the surge current capacity of the device.

5) In the present disclosure, the N-type well region is provided in the P-type well region. When the resistivity of the N-type well region is smaller than the resistivity of the N-type epitaxial layer, and when the device is turned on, the on-resistance of the device can be significantly reduced.

BRIEF DESCRIPTION OF THE DRAWINGS

The drawings are used for a further understanding of the present disclosure and form part of the specification to explain the present disclosure with the specific embodiments below, but form no limit to the present disclosure. In the drawings.

Description of the reference signs: 1. cathode metal; 2. N-type silicon carbide substrate; 3. N-type silicon carbide epitaxial layer; 4. N-type high resistance region; 5. groove; 6. P-type well region; 7. N-type well region; 8. anode metal; 9. N-type high resistance layer; 10. insulating dielectric layer; 11. conductive polysilicon; 12. block-shaped P-type region.

DETAILED DESCRIPTION OF THE EMBODIMENTS

The present disclosure will be further described hereinafter in conjunction with the specific drawings and embodiments.

The specific embodiments of the present disclosure will be described in detail below with reference to the drawings. It should be understood that the specific embodiments described herein are used only to illustrate and explain the present disclosure and form no limit to the present disclosure.

Figure 2:
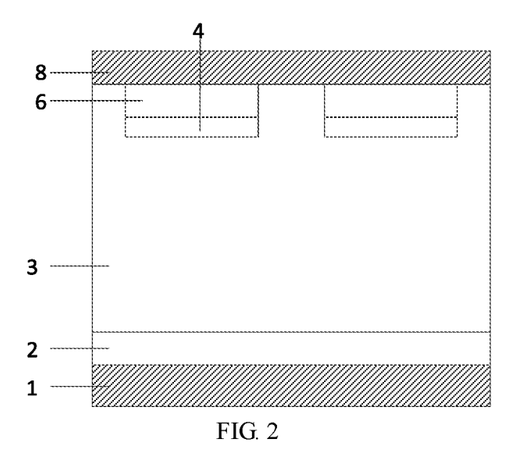
FIG. 2 is a structural schematic view of a silicon carbide Schottky diode in Embodiment 1 of the present disclosure.

Embodiment 1: a silicon carbide diode having a high surge current capability is provided as shown in FIG. 2. In the cross-sectional direction of the device, the cathode metal 1, the N-type silicon carbide substrate 2, the N-type silicon carbide epitaxial layer 3, and the anode metal 8 are sequentially arranged from bottom to top. A plurality of P-type well regions 6 are provided in the N-type silicon carbide epitaxial layer 3. The anode metal 8 forms the Schottky contact with the N-type epitaxial layer 3 and forms the ohmic contact with the P-type well region 6.

The N-type high resistance region 4 is provided under the P-type well region 6 or on the lower surface of the P-type well region 6. The width of the N-type high resistance region 4 is identical to the width of the P-type well region 6. The resistivity of the N-type high resistance region 4 is higher than the resistivity of the N-type silicon carbide epitaxial layer 3.

Figure 3:
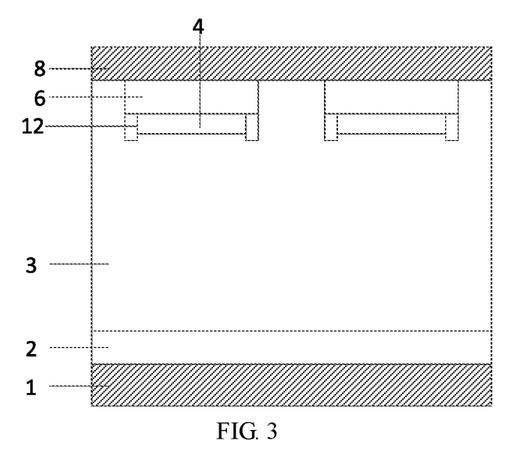
FIG. 3 is a structural schematic view of a silicon carbide Schottky diode in Embodiment 2 of the present disclosure.

Embodiment 2: a silicon carbide diode having a high surge current capability is provided as shown in FIG. 3. In the cross-sectional direction of the device, the cathode metal 1, the N-type silicon carbide substrate 2, the N-type silicon carbide epitaxial layer 3, and the anode metal 8 are sequentially arranged from bottom to top. A plurality of P-type well regions 6 are provided in the N-type silicon carbide epitaxial layer 3. The anode metal 8 forms the Schottky contact with the N-type epitaxial layer 3 and forms the ohmic contact with the P-type well region 6.

The N-type high resistance region 4 is provided under the P-type well region 6 or on the lower surface of the P-type well region 6 and the resistivity of the N-type high resistance region 4 is higher than the resistivity of the N-type silicon carbide epitaxial layer 3. The block-shaped P-type region 12 is provided on both sides of the N-type high resistance region 4 and the block-shaped P-type region 12 is adjacent and connected to the N-type silicon carbide epitaxial layer 3. The bottom of the block-shaped P-type region 12 extends through the N-type high resistance region 4 into the N-type epitaxial layer 3. The width of the block-shaped P-type region 12 is smaller than or equal to the thickness of the N-type high resistance region 4.

Figure 4:
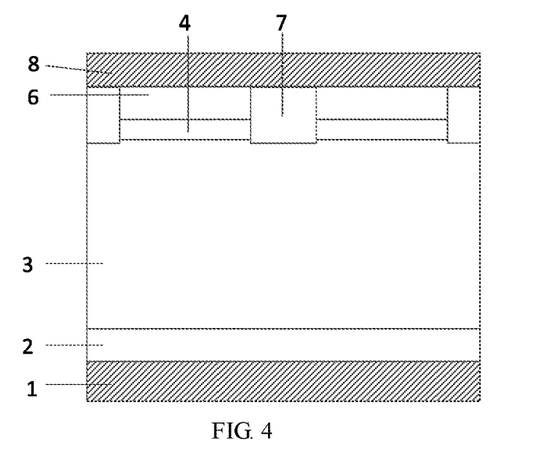
FIG. 4 is a structural schematic view of a silicon carbide Schottky diode in Embodiment 3 of the present disclosure.

Embodiment 3: a silicon carbide diode having a high surge current capability is provided as shown in FIG. 4. In the cross-sectional direction of the device, the cathode metal 1, the N-type silicon carbide substrate 2, the N-type silicon carbide epitaxial layer 3, and the anode metal 8 are sequentially arranged from bottom to top. A plurality of P-type well regions 6 are provided in the N-type silicon carbide epitaxial layer 3. The anode metal 8 forms the Schottky contact with the N-type epitaxial layer 3 and forms the ohmic contact with the P-type well region 6.

The N-type high resistance region 4 is provided under the P-type well region 6 or on the lower surface of the P-type well region 6. The width of the N-type high resistance region 4 is identical to the width of the P-type well region 6 and the resistivity of the N-type high resistance region 4 is higher than the resistivity of the N-type silicon carbide epitaxial layer 3.

The N-type well region 7 is provided between adjacent P-type well regions 6 and the N-type well region 7 is adjacent and connected to the P-type well region 6. The resistivity of the N-type well region 7 is smaller than the resistivity of the N-type silicon carbide epitaxial layer 3.

Figure 5:
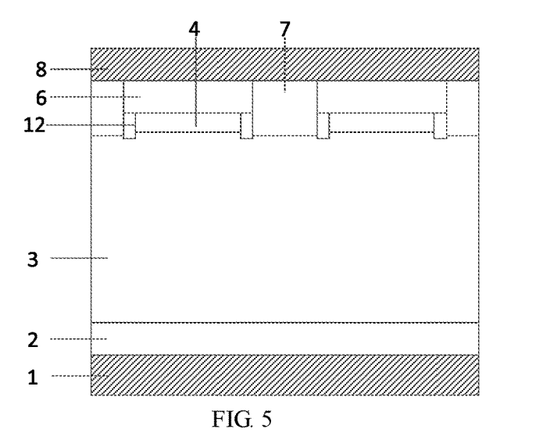
FIG. 5 is a cross-sectional view of a silicon carbide Schottky diode in Embodiment 4 of the present disclosure.

Embodiment 4: As shown in FIG. 5, the present embodiment is the same as Embodiment 1 except that the N-type well region 7 is provided between adjacent P-type well regions 6, the N-type well region 7 is adjacent and connected to the P-type well region 6, and the resistivity of the N-type well region 7 is smaller than the resistivity of the N-type silicon carbide epitaxial layer 3.

The block-shaped P-type region 12 is provided on both sides of the N-type high resistance region 4 and the block-shaped P-type region 12 is adjacent and connected to the N-type silicon carbide epitaxial layer 3. The bottom of the block-shaped P-type region 12 extends through the N-type high resistance region 4 into the N-type epitaxial layer 3. The width of the block-shaped P-type region 12 is smaller than or equal to the thickness of the N-type high resistance region 4.

Figure 6:
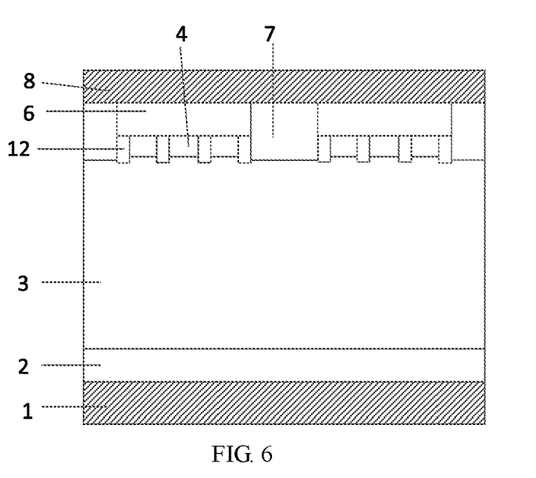
FIG. 6 is a structural schematic view of a silicon carbide Schottky diode having four block-shaped P-type regions in Embodiment 5 of the present disclosure.

Embodiment 5: As shown in FIG. 6, taking a device cell as an example, the present embodiment is the same as Embodiment 4 except that not only the block-shaped P-type region 12 is provided on both sides of the N-type high resistance region 4, but also two block-shaped P-type regions 12 are uniformly provided in the N-type high resistance region 4. The bottom of the block-shaped P-type region 12 sequentially extends through the P-type well regions 6 and the N-type high resistance region 4 into the N-type epitaxial layer 3.

Embodiment 5 indicates that in the present disclosure, the number of the block-shaped P-type regions 12 in the device cell is added to further prolong the flow path of the electron current and to increase the lateral resistance under the P-type well region 6, thereby ensuring the PN junction in the device can be opened more effectively under the high current condition and enhancing the surge current capacity of the device. The number of block-shaped P-type regions 12 can be determined according to the actual device design current.

Figure 7:
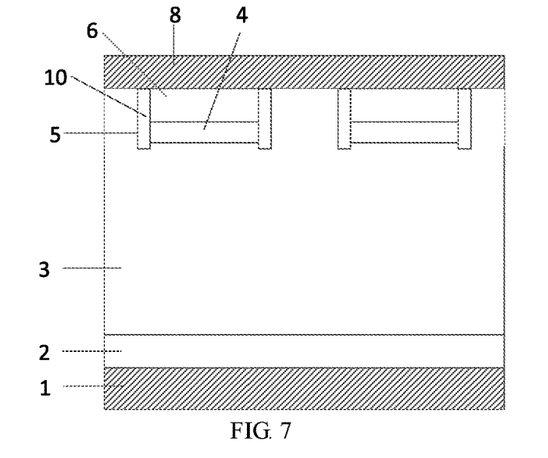
FIG. 7 is a structural schematic view of a silicon carbide Schottky diode in Embodiment 6 of the present disclosure.

Embodiment 6: A silicon carbide diode having a high surge current capability is provided as shown in FIG. 7. In the cross-sectional direction of the device, the cathode metal 1, the N-type silicon carbide substrate 2, the N-type silicon carbide epitaxial layer 3, and the anode metal 8 are sequentially arranged from bottom to top. A plurality of P-type well regions 6 are provided in the N-type silicon carbide epitaxial layer 3. The anode metal 8 forms the Schottky contact with the N-type epitaxial layer 3 and forms the ohmic contact with the P-type well region 6.

The N-type high resistance region 4 is provided under the P-type well region 6 or on the lower surface of the P-type well region 6. The width of the N-type high resistance region 4 is identical to the width of the P-type well region 6 and the resistivity of the N-type high resistance region 4 is higher than the resistivity of the N-type silicon carbide epitaxial layer 3. The groove 5 is provided on both sides of the P-type well region 6. The groove 5 is adjacent and connected to the N-type silicon carbide epitaxial layer 3 and the groove 5 is filled with the insulating dielectric layer 10. The bottom of the groove 5 extends through the N-type high resistance region 4 into the N-type epitaxial layer 3.

Figure 8:
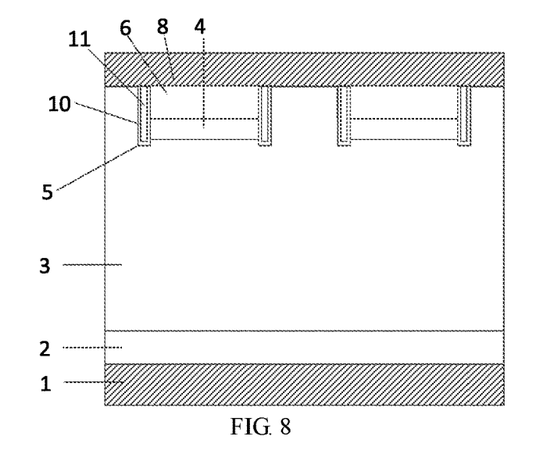
FIG. 8 is a structural schematic view of a silicon carbide Schottky diode in Embodiment 7 of the present disclosure.

Embodiment 7: A silicon carbide diode having a high surge current capability is provided as shown in FIG. 8. In the cross-sectional direction of the device, the cathode metal 1, the N-type silicon carbide substrate 2, the N-type silicon carbide epitaxial layer 3, and the anode metal 8 are sequentially arranged from bottom to top. A plurality of P-type well regions 6 are provided in the N-type silicon carbide epitaxial layer 3. The anode metal 8 forms the Schottky contact with the N-type epitaxial layer 3 and forms the ohmic contact with the P-type well region 6.

The N-type high resistance region 4 is provided under the P-type well region 6 or on the lower surface of the P-type well region 6. The width of the N-type high resistance region 4 is identical to the width of the P-type well region 6 and the resistivity of the N-type high resistance region 4 is higher than the resistivity of the N-type silicon carbide epitaxial layer 3. The groove 5 is provided on both sides of the P-type well region 6. The groove 5 is adjacent and connected to the N-type silicon carbide epitaxial layer 3. The bottom of the groove 5 extends through the N-type high resistance region 4 into the N-type epitaxial layer 3. The insulating dielectric layer 10 is provided on the sidewalls and the bottom of the groove 5 and the insulating dielectric layer 10 wraps the conductive polysilicon 11. The conductive polysilicon 11 is electrically connected to the anode metal 8.

Figure 9:
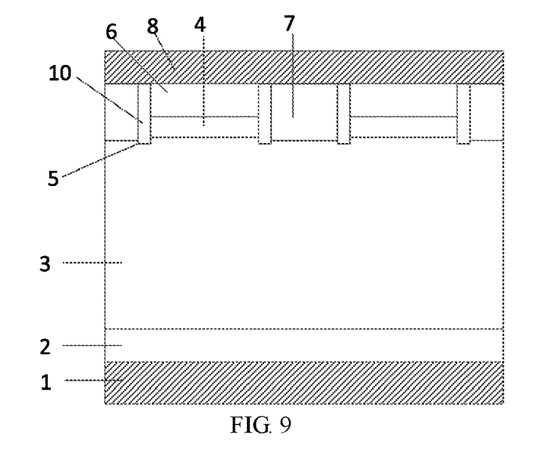
FIG. 9 is a structural schematic view of a silicon carbide Schottky diode in Embodiment 8 of the present disclosure.

Embodiment 8: A silicon carbide diode having a high surge current capability is provided as shown in FIG. 9. In the cross-sectional direction of the device, the cathode metal 1, the N-type silicon carbide substrate 2, the N-type silicon carbide epitaxial layer 3, and the anode metal 8 are sequentially arranged from bottom to top. A plurality of P-type well regions 6 are provided in the N-type silicon carbide epitaxial layer 3. The anode metal 8 forms the Schottky contact with the N-type epitaxial layer 3 and forms the ohmic contact with the P-type well region 6.

The N-type high resistance region 4 is provided under the P-type well region 6 or on the lower surface of the P-type well region 6. The width of the N-type high resistance region 4 is identical to the width of the P-type well region 6. The resistivity of the N-type high resistance region 4 is higher than the resistivity of the N-type silicon carbide epitaxial layer 3. The groove 5 is provided on both sides of the P-type well region 6. The groove 5 is filled with the insulating dielectric layer 10. The bottom of the groove 5 extends through the N-type high resistance region 4 into the N-type silicon carbide epitaxial layer 3.

The N-type well region 7 is provided between adjacent P-type well regions 6 and the N-type well region 7 is adjacent and connected to the groove 5. The resistivity of the N-type well region 7 is smaller than the resistivity of the N-type silicon carbide epitaxial layer 3.

Figure 10:
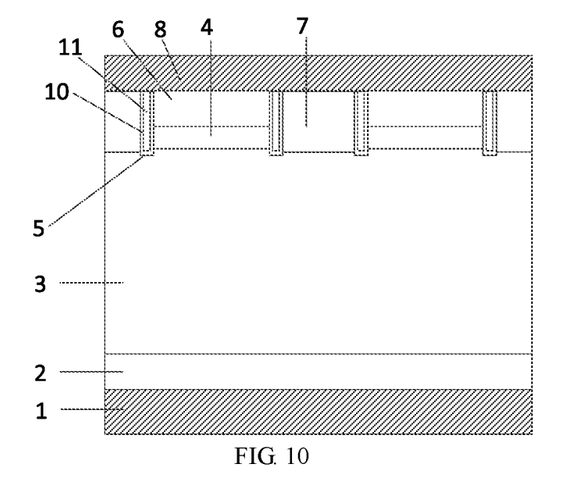
FIG. 10 is a structural cross-sectional view of a silicon carbide Schottky diode having four grooves in Embodiment 9 of the present disclosure.

Embodiment 9: As shown in FIG. 10, the present embodiment is the same as Embodiment 1 except that the insulating dielectric layer 10 is provided on the sidewalls and the bottom of the groove 5, the insulating dielectric layer 10 wraps the conductive polysilicon 11, and the conductive polysilicon 11 is electrically connected to the anode metal 8. The N-type well region 7 is provided between adjacent P-type well regions 6 and the N-type well region 7 is adjacent and connected to the groove 5. The resistivity of the N-type well region 7 is smaller than the resistivity of the N-type silicon carbide epitaxial layer 3.

Figure 11:
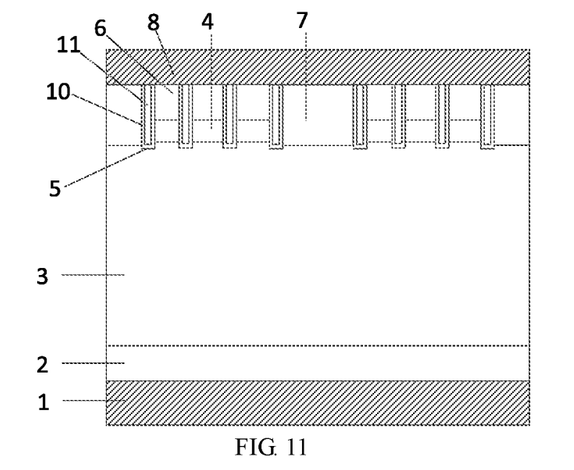
FIG. 11 is a structural schematic view of a silicon carbide Schottky diode in Embodiment 10 of the present disclosure.

Embodiment 10: As shown in FIG. 11, taking a device cell as an example, the present embodiment is the same as Embodiment 4 except that not only the groove 5 is provided on both sides of the P-type well region 6, but also two grooves 5 are uniformly provided in the P-type well region 6. The bottom of the groove 5 sequentially extends through the P-type well regions 6 and the N-type high resistance region 4 into the N-type silicon carbide epitaxial layer 3.

Embodiment 10 indicates that in the present disclosure, the density of the groove 5 in the device cell is increased to further prolong the flow path of the electron current and to increase the lateral resistance under the P-type well region 6, thereby ensuring the PN junction in the device can be opened more effectively under the high current condition and enhancing the surge current capacity of the device. The number of grooves 5 can be determined according to the actual device design current.

Figure 12:
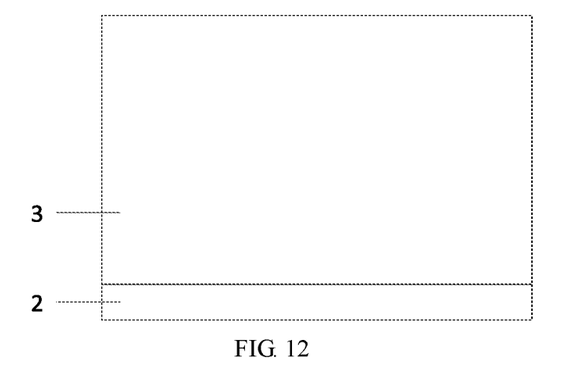
FIG. 12 is a cross-sectional structural view showing an N-type silicon carbide substrate and an N-type silicon carbide epitaxial layer formed in Embodiment 2 and Embodiment 7 of the present disclosure.

The manufacturing method of the silicon carbide diode having the high surge current capability in Embodiment 2 of the present disclosure is as follows:

As shown in FIG. 12, step 1: the N-type silicon carbide substrate 2 is selected and an epitaxial process is performed to grow the N-type silicon carbide epitaxial layer 3 on the upper surface of the N-type silicon carbide substrate 2.

Figure 13:
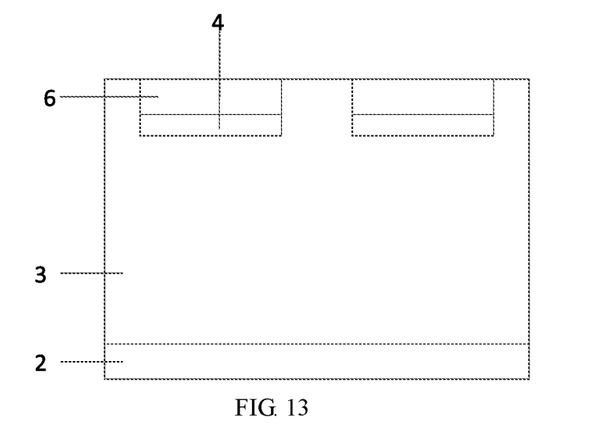
FIG. 13 is a cross-sectional structural view showing a P-type well region and an N-type high resistance region formed by Embodiment 2 and Embodiment 7 of the present disclosure.
Figure 14:
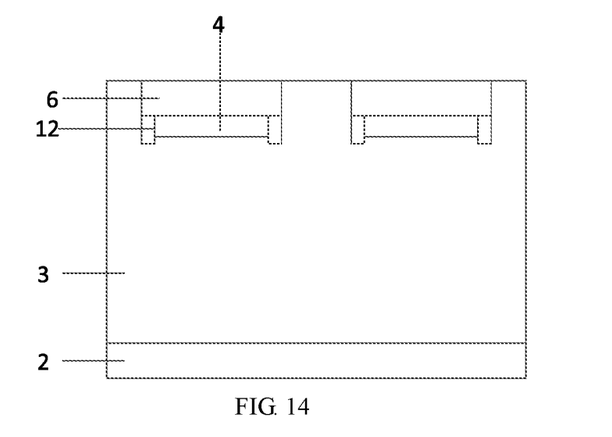
FIG. 14 is a cross-sectional structural view showing a block-shaped P-type region formed in Embodiment 2 of the present disclosure.

As shown in FIG. 13, step 2: under the shielding of the first photoresist, the high energy P-type impurity is selectively injected to form the N-type high resistance region 4, the low energy P-type impurity is selectively injected to form the P-type well region 6, and then the first photoresist is removed. Specifically, the first injection dose of the P-type impurity (forming the N-type high resistance region 4) is smaller than the second injection dose of the P-type impurity (forming the P-type well region 6), and the order of the two injections can be reversed;

As shown in FIG. 14, step 3: under the shielding of the second photoresist, the high energy P-type impurity is selectively injected to form the block-shaped P-type region 12, the high-temperature annealing is performed to activate impurity ions to form the P-type well region 6, the N-type high resistance region 4 under the P-type well region 6, and the block-shaped P-type region 12 on both sides of the N-type high resistance region 4.

Figure 15:
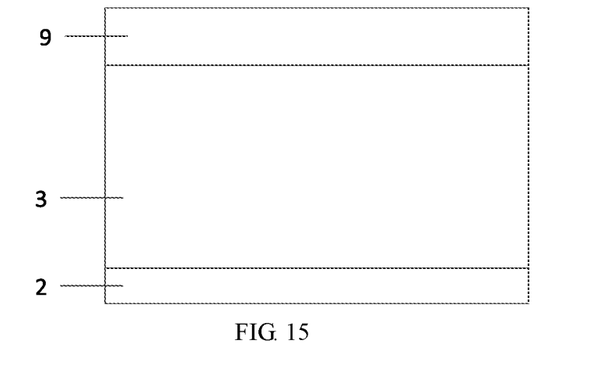
FIG. 15 is a cross-sectional structural view showing an N-type substrate, an N-type epitaxial layer, and an N-type high resistance region formed in Embodiment 4 and Embodiment 9 of the present disclosure.

The N-type high resistance region 4 in Embodiment 2 of the present disclosure can also be obtained by an epitaxial process, as follows:

As shown in FIG. 15, the N-type high resistance layer 9 grows on the upper surface of the N-type silicon carbide epitaxial layer 3.

Figure 16:
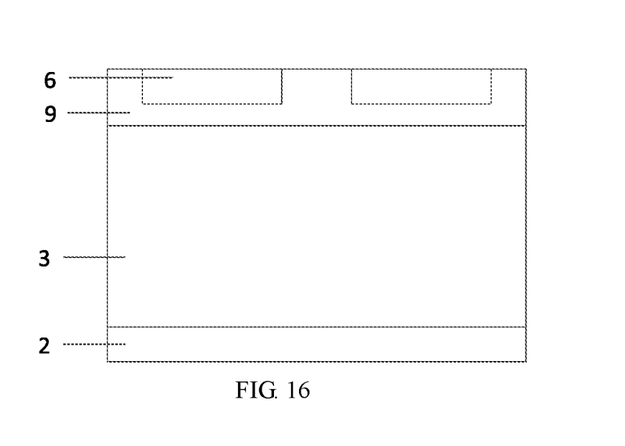
FIG. 16 is a cross-sectional structural view showing a P-type well region formed in Embodiment 4 and Embodiment 9 of the present disclosure.

As shown in FIG. 16, under the shielding of the first photoresist, the lower energy P-type impurity is selectively injected into the surface of the N-type high resistance layer 9 to form the P-type well region 6, and the first photoresist is removed.

Figure 17:
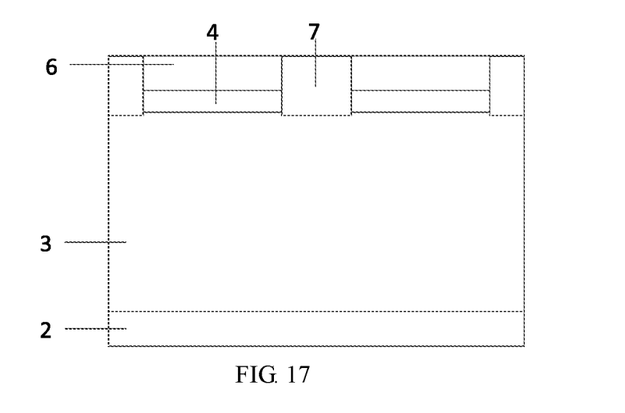
FIG. 17 is a cross-sectional structural view showing an N-type well region formed in Embodiment 4 and Embodiment 9 of the present disclosure.

As shown in FIG. 17, under the shielding of the third photoresist, the N-type impurity is selectively injected into the surface of the N-type high resistance layer 9, and the third photoresist is removed.

Subsequently, the high-temperature annealing is performed to activate impurity ions to form the P-type well region 6, and the N-type high resistance region 4 under the P-type well region 6. At the same time, due to the injection of the N-type impurity, the resistivity of the N-type high resistance layer 9 between the adjacent P-type well regions 6 is identical to the resistivity of the N-type silicon carbide epitaxial layer 3 (that is, the resistivity of the N-type well region 7 is equal to the resistivity of the N-type silicon carbide epitaxial layer 3).

In the present embodiment, the resistivity of the N-type high resistance layer 9 is identical to the resistivity of the N-type high resistance region 4 and the resistivity of the N-type high resistance region 4 is greater than the resistivity of the N-type silicon carbide epitaxial layer 3.

In the present embodiment, the bottom of the block-shaped P-type region 12 extends through the N-type high resistance region 4 into the N-type silicon carbide epitaxial layer 3. The width of the block-shaped P-type region 12 is smaller than the thickness of the N-type high resistance region 4.

As shown in FIG. 3, step 4: backgrinding is performed on the device and the metal layer is deposited on the lower surface of the device to form the cathode metal 1. The cathode metal 1 forms the ohmic contact with the N-type silicon carbide substrate 2. The metal layer is deposited on the upper surface of the device to form the anode metal 8. The anode metal 8 forms the Schottky contact with the N-type silicon carbide epitaxial layer 3 and forms the ohmic contact with the P-type well region 6. Finally, the silicon carbide power diode device can be obtained.

The manufacturing method of the silicon carbide diode having the high surge current capability in Embodiment 4 of the present disclosure is as follows:

As shown in FIG. 15, step 1: the N-type silicon carbide substrate 2 is selected and an epitaxial process is performed to grow the N-type silicon carbide epitaxial layer 3 on the upper surface of the N-type silicon carbide substrate 2 and then the N-type high resistance layer 9 grows on the upper surface of the N-type silicon carbide epitaxial layer 3.

As shown in FIG. 16, step 2: under the shielding of the first photoresist, the P-type impurity is selectively injected into the surface of the N-type high resistance layer 9 to form the P-type well region 6, and the first photoresist is removed.

As shown in FIG. 17, step 3: under the shielding of the third photoresist, the N-type impurity is selectively injected into the surface of the N-type high resistance layer 9 to form the N-type well region 7, and the third photoresist is removed.

In the present embodiment, the resistivity of the N-type high resistance region 4 is identical to the resistivity of the N-type high resistance layer 9, the resistivity of the N-type well region 7 is smaller than the resistivity of the N-type silicon carbide epitaxial layer 3, and the resistivity of the N-type silicon carbide epitaxial layer 3 is smaller than the resistivity of the N-type high resistance region 4.

Figure 18:
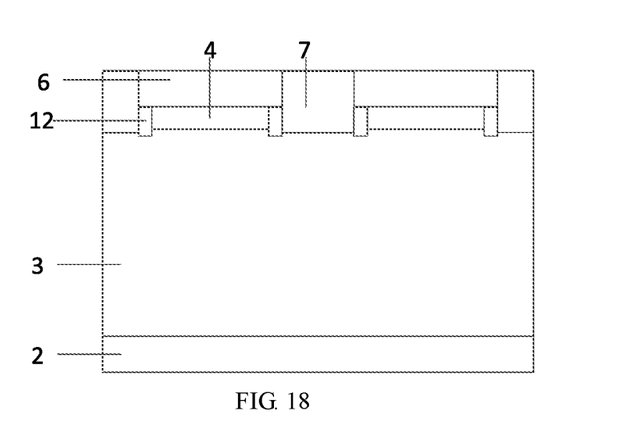
FIG. 18 is a cross-sectional structural view showing a block-shaped P-type region formed in Embodiment 4 of the present disclosure.

As shown in FIG. 18, step 4: under the shielding of the second photoresist, the P-type impurity is selectively injected to form the block-shaped P-type region 12, the high-temperature annealing is performed to activate impurity ions to form the P-type well region 6, the N-type high resistance region 4 under the P-type well region 6, the N-type well region 7 between the P-type well regions 6, and the block-shaped P-type region 12 on both sides of the N-type high resistance region 4.

In the present embodiment, the resistivity of the N-type high resistance layer 9 is identical to the resistivity of the N-type high resistance region 4, the resistivity of the N-type high resistance region 4 is greater than the resistivity of the N-type silicon carbide epitaxial layer 3 and the N-type well region 7, and the resistivity of the N-type well region 7 is smaller than the resistivity of the N-type silicon carbide epitaxial layer 3.

In the present embodiment, the bottom of the block-shaped P-type region 12 extends through the N-type high resistance region 4 into the N-type silicon carbide epitaxial layer 3. The width of the block-shaped P-type region 12 is smaller than the thickness of the N-type high resistance region 4.

As shown in FIG. 5, step 5: backgrinding is performed on the device and the metal layer is deposited on the lower surface of the device to form the cathode metal 1. The cathode metal 1 forms the ohmic contact with the N-type silicon carbide substrate 2. The metal layer is deposited on the upper surface of the device to form the anode metal 8, the anode metal 8 forms the Schottky contact with the N-type silicon carbide epitaxial layer 3 and forms the ohmic contact with the P-type well region 6. Finally, the silicon carbide power diode device can be obtained.

The manufacturing method of the silicon carbide diode having the high surge current capability in Embodiment 7 of the present disclosure is as follows:

As shown in FIG. 12, step 1: the N-type silicon carbide substrate 2 is selected and an epitaxial process is performed to grow the N-type silicon carbide epitaxial layer 3 on the upper surface of the N-type silicon carbide substrate 2.

As shown in FIG. 13, step 2: under the shielding of the first photoresist, the high energy P-type impurity is selectively injected to form the N-type high resistance region 4 and the low energy P-type impurity is selectively injected to form the P-type well region 6. Next, the high-temperature annealing is performed to activate impurity ions to form the P-type well region 6, and the N-type high resistance region 4 under the P-type well region 6. Next, the first photoresist is removed. Specifically, the first injection dose of the P-type impurity is smaller than the second injection dose of the P-type impurity. The order of the two injections can be reversed.

The N-type high resistance region 4 in Embodiment 7 of the present disclosure can also be obtained by an epitaxial process, as follows:

As shown in FIG. 15, the N-type high resistance layer 9 grows on the upper surface of the N-type silicon carbide epitaxial layer 3.

As shown in FIG. 16, under the shielding of the first photoresist, the lower energy P-type impurity is selectively injected into the surface of the N-type high resistance layer 9 to form the P-type well region 6, and the first photoresist is removed.

As shown in FIG. 17, under the shielding of the third photoresist, the N-type impurity is selectively injected into the surface of the N-type high resistance layer 9, and the third photoresist is removed.

Subsequently, the high-temperature annealing is performed to activate impurity ions to form the P-type well region 6, and the N-type high resistance region 4 under the P-type well region 6. Meanwhile, due to the injection of the N-type impurity, the resistivity of the N-type high resistance layer 9 between the adjacent P-type well regions 6 is identical to the resistivity of the N-type silicon carbide epitaxial layer 3 (that is, the resistivity of the N-type well region 7 is equal to the resistivity of the N-type silicon carbide epitaxial layer 3).

Figure 19:
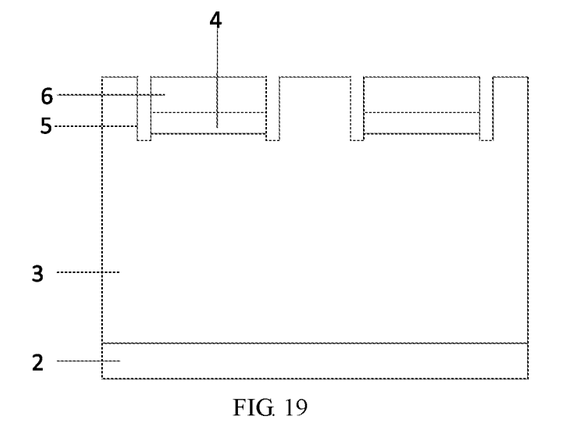
FIG. 19 is a cross-sectional structural view showing a groove etched in Embodiment 7 of the present disclosure.

In the present embodiment, the resistivity of the N-type high resistance layer 9 is identical to the resistivity of the N-type high resistance region 4, and the resistivity of the N-type high resistance region 4 is greater than the resistivity of the N-type silicon carbide epitaxial layer 3;

As shown in FIG. 19, step 3: under the shielding of the second photoresist, the surface of the device is etched to obtain the groove 5. The groove 5 is adjacent and connected to the P-type well region 6 and the N-type high resistance region 4.

In the present embodiment, the bottom of the groove 5 extends through the N-type high resistance region 4 into the N-type silicon carbide epitaxial layer 3.

Figure 20:
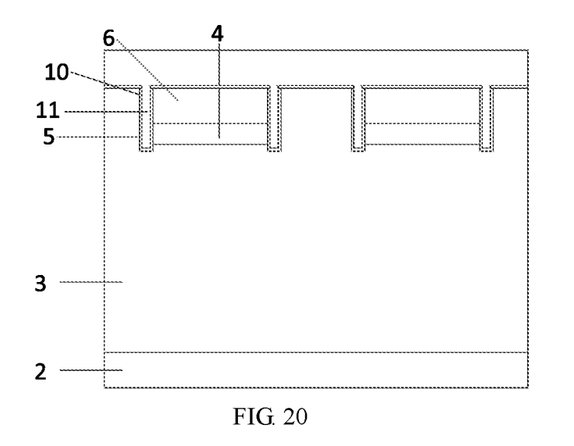
FIG. 20 is a cross-sectional structural view showing an insulating oxide layer and polysilicon deposited in Embodiment 7 of the present disclosure.

As shown in FIG. 20, step 4: an insulating oxide layer is deposited on the surface of the device and the groove 5, and the polysilicon is deposited on the insulating oxide layer so that the groove 5 is filled with polysilicon.

Figure 21:
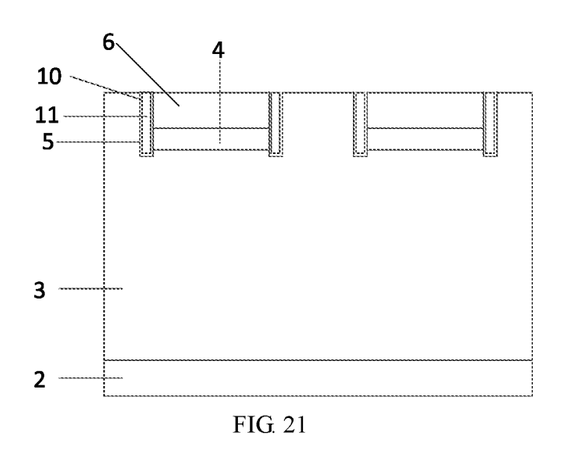
FIG. 21 is a cross-sectional structural view showing conductive polysilicon and an insulating dielectric layer formed in Embodiment 7 of the present disclosure.

As shown in FIG. 21, step 5: the polysilicon and the insulating oxide layer are sequentially etched, and the polysilicon and the insulating oxide layer are both removed from the surface of the device. The conductive polysilicon 11 and the insulating dielectric layer 10 wrapping the conductive polysilicon 11 are formed in the groove 5.

As shown in FIG. 8, step 6: backgrinding is performed on the device and the metal layer is deposited on the lower surface of the device to form the cathode metal 1. The cathode metal 1 forms the ohmic contact with the N-type silicon carbide substrate 2. The metal layer is deposited on the upper surface of the device to form the anode metal 8. The anode metal 8 forms the Schottky contact with the N-type silicon carbide epitaxial layer 3 and forms the ohmic contact with the P-type well region 6. Further, the anode metal 8 also is electrically connected to the conductive polysilicon 11 to finally obtain the silicon carbide power diode device.

The manufacturing method of the silicon carbide diode having the high surge current capability in Embodiment 9 of the present disclosure is as follows:

As shown in FIG. 15, step 1: the N-type silicon carbide substrate 2 is selected and an epitaxial process is performed to grow the N-type silicon carbide epitaxial layer 3 on the upper surface of the N-type silicon carbide substrate 2 and to grow the N-type high resistance layer 9 on the upper surface of the N-type silicon carbide epitaxial layer 3.

As shown in FIG. 16, step 2: under the shielding of the first photoresist, the P-type impurity is selectively injected into the surface of the N-type high resistance layer 9 to form the P-type well region 6, and the first photoresist is removed.

As shown in FIG. 17, step 3: under the shielding of the third photoresist, the N-type impurity is selectively injected into the surface of the N-type high resistance layer 9 to form the N-type well region 7, and the third photoresist is removed.

Then, the high-temperature annealing is to activate impurity ions performed to form the P-type well region 6, the N-type high resistance region 4 under the P-type well region 6, and the N-type well region 7 between the P-type well regions 6.

In the present embodiment, the resistivity of the N-type high resistance region 4 is identical to the resistivity of the N-type high resistance layer 9, the resistivity of the N-type well region 7 is smaller than the resistivity of the N-type silicon carbide epitaxial layer 3, and the resistivity of the N-type silicon carbide epitaxial layer 3 is smaller than the resistivity of the N-type high resistance region 4.

Figure 22:
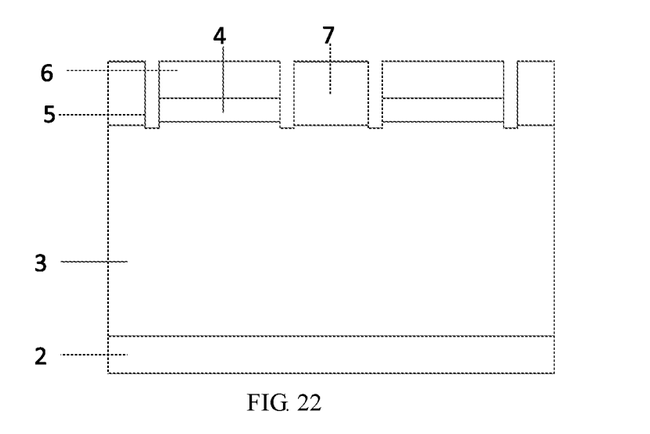
FIG. 22 is a cross-sectional structural view showing a groove etched in Embodiment 9 of the present disclosure.

As shown in FIG. 22, step 4: under the shielding of the second photoresist, the surface of the device is etched to obtain the groove 5 and the groove 5 is located in both sides of the P-type well region 6.

In the present embodiment, the bottom of the groove 5 extends through the N-type high resistance region 4 into the N-type silicon carbide epitaxial layer 3.

Figure 23:
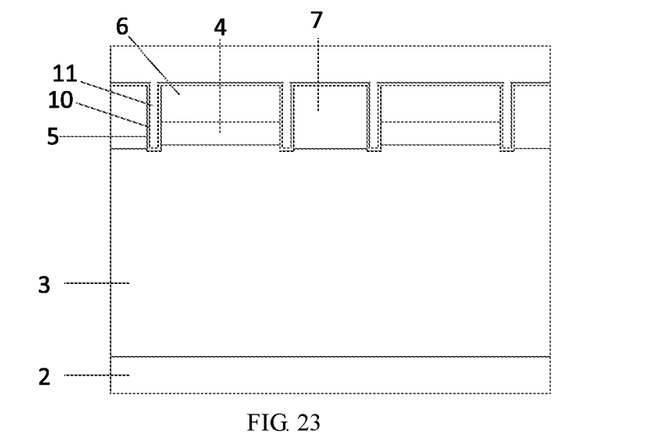
FIG. 23 is a cross-sectional structural view showing an insulating oxide layer and polysilicon deposited in Embodiment 9 of the present disclosure.

As shown in FIG. 23, step 5: an insulating oxide layer is deposited on the surface of the device and the groove 5, and the polysilicon is deposited on the insulating oxide layer so that the groove 5 is filled with polysilicon.

Figure 24:
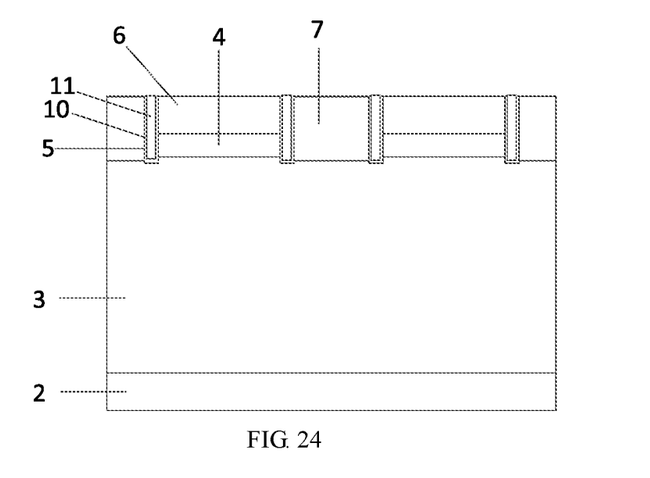
FIG. 24 is a cross-sectional structural view showing the formation of conductive polysilicon and an insulating dielectric layer in Embodiment 9 of the present disclosure.

As shown in FIG. 24, step 6: the polysilicon and the insulating oxide layer are sequentially etched, and the polysilicon and the insulating oxide layer on the surface of the device are both removed. The conductive polysilicon 11 and the insulating dielectric layer 10 wrapping the conductive polysilicon 11 are formed in the groove.

As shown in FIG. 10, step 7: backgrinding is performed on the device. The metal layer is deposited on the lower surface of the device to form the cathode metal 1. The cathode metal 1 forms the ohmic contact with the N-type silicon carbide substrate 2. The metal layer is deposited on the upper surface of the device to form the anode metal 8. The anode metal 8 forms the Schottky contact with the N-type silicon carbide epitaxial layer 3 and forms the ohmic contact with the P-type well region 6. Further, the anode metal 8 is electrically connected to the conductive polysilicon 11 to finally obtain the silicon carbide power diode device.

When the device of the present disclosure is subjected to a voltage, the P-type well region 6 can disperse the electric field on the surface of the device to increase the voltage resistant capacity of the device. At that moment of device conduction, the current will first pass through the Schottky contact position, and in the meantime, the current will flow through the N-type high resistance region 4 so that the voltage difference between the P-type well region 6 and the N-type high resistance region 4 increase. When the voltage difference comes up to 3V, the PN junction turns on and the electron holes are injected into the N-type silicon carbide epitaxial layer 3. Now, the device is completely in the forward conducting state.

The present disclosure and the embodiments thereof have been described above, which forms no limit thereto. The figures shown in the drawings are also only one of the embodiments of the present disclosure, and the actual structure is not limited thereto. Therefore, without deviating from the objective of the present disclosure, if an ordinary technical person in the field is inspired by the present disclosure to design a structure mode and embodiment similar to the present technical solution, the design shall fall within the protection scope of the present disclosure.

What is claimed is:

1. A silicon carbide diode having a high surge current capability, comprising: a semiconductor base plate, wherein the semiconductor base plate comprises an N-type silicon carbide substrate and an N-type silicon carbide epitaxial layer located on the N-type silicon carbide substrate, a plurality of P-type well regions are provided on an upper portion of the N-type silicon carbide epitaxial layer, an N-type high resistance region is provided under the plurality of P-type well regions or on a lower surface of the plurality of P-type well regions and a resistivity of the N-type high resistance region is greater than a resistivity of the N-type silicon carbide epitaxial layer;

further comprising a plurality of block-shaped P-type regions evenly arranged at intervals and provided in the N-type high resistance region, the plurality of block-shaped P-type regions extend from a junction of the N-type high resistance region and the P-type well region into the N-type high resistance region or extend through the N-type high resistance region into the N-type silicon carbide epitaxial layer.

2. The silicon carbide diode having the high surge current capability according to claim 1, further comprising an N-type well region provided between adjacent P-type well regions, and a resistivity of the N-type well region is equal to the resistivity of the N-type silicon carbide epitaxial layer or smaller than the resistivity of the N-type silicon carbide epitaxial layer.

3. The silicon carbide diode having the high surge current capability according to claim 1, further comprising an anode metal provided on an upper surface of the semiconductor base plate, and the anode metal forms a Schottky contact with the N-type silicon carbide epitaxial layer and forms a first ohmic contact with the P-type well region; a cathode metal is provided on a lower surface of the semiconductor base plate, and the cathode metal forms a second ohmic contact with the N-type silicon carbide substrate.

4. A silicon carbide diode having a high surge current capability, comprising: a semiconductor base plate, wherein the semiconductor base plate comprises an N-type silicon carbide substrate and an N-type silicon carbide epitaxial layer located on the N-type silicon carbide substrate, a plurality of P-type well regions are provided on an upper portion of the N-type silicon carbide epitaxial layer, an N-type high resistance region is provided under the plurality of P-type well regions or on a lower surface of the plurality of P-type well regions; a resistivity of the N-type high resistance region is greater than a resistivity of the N-type silicon carbide epitaxial layer; a plurality of grooves are provided in the P-type well region; a first groove located at an edge of the P-type well region is adjacent and connected to the N-type silicon carbide epitaxial layer; the first groove extends from an upper surface of the semiconductor base plate through the P-type well region into the N-type high resistance region, or sequentially extends through the P-type well region and the N-type high resistance region into the N-type silicon carbide epitaxial layer; and the first groove is filled with an insulating dielectric layer.

5. The silicon carbide diode having the high surge current capability according to claim 4, the first groove is provided with a conductive polysilicon and an insulating dielectric layer wrapping the conductive polysilicon, and the conductive polysilicon is electrically connected to the anode metal.

6. The silicon carbide diode having the high surge current capability according to claim 4, further comprising an N-type well region provided between adjacent P-type well regions; the N-type well region is directly adjacent to the first groove; a resistivity of the N-type well region is smaller than the resistivity of the N-type high resistance region; and the resistivity of the N-type well region is equal to the resistivity of the N-type silicon carbide epitaxial layer or smaller than the resistivity of the N-type silicon carbide epitaxial layer.

7. The silicon carbide diode having the high surge current capability according to claim 4, further comprising an anode metal provided on an upper surface of the semiconductor base plate, and the anode metal forms a Schottky contact with the N-type silicon carbide epitaxial layer and forms a first ohmic contact with the P-type well region; a cathode metal is provided on a lower surface of the semiconductor base plate, and the cathode metal forms a second ohmic contact with the N-type silicon carbide substrate.

8. A method for manufacturing a silicon carbide diode having a high surge current capability, comprising the following steps:

step 1: selecting an N-type silicon carbide substrate and growing an N-type silicon carbide epitaxial layer on an upper surface of the N-type silicon carbide substrate by using an epitaxial process;

step 2: under the shielding of a first photoresist, selectively injecting a high energy P-type impurity, selectively injecting a low energy P-type impurity, and performing high temperature annealing to activate impurity ions to form an N-type high resistance region and a P-type well region;

step 3: under the shielding of a second photoresist, etching the N-type silicon carbide epitaxial layer to obtain a plurality of grooves in the P-type well region;

step 4: growing an insulating oxide layer on a surface of the N-type silicon carbide epitaxial layer and in the plurality of grooves, and filling the plurality of grooves with the insulating oxide layer;

step 5: etching the insulating oxide layer, removing the insulating oxide layer on the surface of the N-type silicon carbide epitaxial layer and forming an insulating dielectric layer in the plurality of grooves;

step 6: performing backgrinding on a lower surface of the N-type silicon carbide substrate, depositing a metal layer to form a cathode metal, depositing a metal layer to form an anode metal on an upper surface of the N-type silicon carbide epitaxial layer, and obtaining a silicon carbide power diode device.

9. The manufacturing method of the silicon carbide diode having the high surge current capability according to claim 8, wherein, in step 4 polysilicon is deposited on the insulating oxide layer to fill the grooves with polysilicon, the polysilicon and the insulating oxide layer on the surface of the device both are sequentially removed to obtain a conductive polysilicon, an insulating dielectric layer wraps the conductive polysilicon in the grooves, and the conductive polysilicon is electrically connected to the anode metal.

10. The manufacturing method of the silicon carbide diode having the high surge current capability according to claim 8, wherein, the N-type high resistance region in step 2 is obtained by the epitaxial process, as follows:

growing the N-type high resistance layer on the upper surface of the N-type silicon carbide epitaxial layer;

under the shielding of the first photoresist, selectively injecting the lower energy P-type impurity into a surface of the N-type high resistance layer, and removing the first photoresist;

under the shielding of a third photoresist, selectively injecting an N-type impurity into the surface of the N-type high resistance layer, and removing the third photoresist;

performing high-temperature annealing to activate impurity ions to form the P-type well region, an N-type well region is located in the P-type well region, and the N-type high resistance region is located under the P-type well region.

11. The manufacturing method of the silicon carbide diode having the high surge current capability according to claim 10, wherein, a resistivity of the N-type well region and a resistivity of the N-type silicon carbide epitaxial layer are smaller than a resistivity of the N-type high resistance region, and a resistivity of the N-type well region is equal to the resistivity of the N-type silicon carbide epitaxial layer or smaller than the resistivity of the N-type silicon carbide epitaxial layer.

12. A method for manufacturing a silicon carbide diode having a high surge current capability, comprising the following steps:

step 1: selecting an N-type silicon carbide substrate and growing an N-type silicon carbide epitaxial layer on an upper surface of the N-type silicon carbide substrate by using an epitaxial process;

step 2: under the shielding of a first photoresist, selectively injecting a high energy P-type impurity, selectively injecting a low energy P-type impurity, and performing high temperature annealing to activate impurity ions to respectively form an N-type high resistance region and a P-type well region;

step 3: performing backgrinding on a lower surface of the N-type silicon carbide substrate, depositing a metal layer to form a cathode metal, and depositing a metal layer to form an anode metal on an upper surface of the N-type silicon carbide epitaxial layer, and obtaining a silicon carbide power diode device.

13. The manufacturing method of the silicon carbide diode having the high surge current capability according to claim 12, wherein, after step 2, under the shielding of a second photoresist, selectively injecting a P-type impurity, then performing high-temperature annealing to activate impurity ions to form a plurality of block-shaped P-type regions distributed at intervals in the N-type high resistance region.

14. The manufacturing method of the silicon carbide diode having the high surge current capability according to claim 12, wherein, the N-type high resistance region in step 2 is obtained by the epitaxial process, as follows:

growing the N-type high resistance layer on the upper surface of the N-type silicon carbide epitaxial layer;

under the shielding of the first photoresist, selectively injecting the lower energy P-type impurity into a surface of the N-type high resistance layer, and removing the first photoresist;

under the shielding of a third photoresist, selectively injecting an N-type impurity into the surface of the N-type high resistance layer, and removing the third photoresist;

performing high-temperature annealing to activate impurity ions to form the P-type well region, an N-type well region is located in the P-type well region, and the N-type high resistance region is located under the P-type well region.

* * * * *